(12) United States Patent
Sogo

(10) Patent No.: US 6,312,996 B1
(45) Date of Patent: Nov. 6, 2001

(54) SEMICONDUCTOR DEVICE AND METHOD FOR FABRICATING THE SAME

(75) Inventor: Seiji Sogo, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/420,455

(22) Filed: Oct. 18, 1999

(30) Foreign Application Priority Data

Oct. 19, 1998  (JP) .................................................. 10-296618

(51) Int. Cl.⁷ .................................................. H01L 21/336
(52) U.S. Cl. ............................................. 438/298; 438/306
(58) Field of Search .................................. 438/286, 290, 438/298, 301, 305, 306

(56) References Cited

U.S. PATENT DOCUMENTS 6,124,173 * 9/2000 Gonzalez et al. .................... 438/302

FOREIGN PATENT DOCUMENTS

| 52117586 | 10/1977 | (JP) . |
| 1127261 | 8/1989 | (JP) . |
| 4-107877 | 4/1992 | (JP) . |
| 4107867 | 4/1992 | (JP) . |
| 4107870 | 4/1992 | (JP) . |
| 4241463 | 8/1993 | (JP) . |
| 738097 | 2/1995 | (JP) . |
| 1084111 | 3/1998 | (JP) . |
| 10-125912 | 5/1998 | (JP) . |

* cited by examiner

Primary Examiner—Tuan H. Nguyen
(74) Attorney, Agent, or Firm—Eric J. Robinson; Nixon Peabody LLP

(57) ABSTRACT

There is provided a method for fabricating a semiconductor device comprising a semiconductor layer of a first conductivity type, a source region of a second conductivity type formed within the semiconductor layer, a drain region of the second conductivity type formed within the semiconductor layer, a channel region provided between the source and drain regions, a gate electrode formed over the channel region, and a buried region of the first conductivity type having at least a part included in the drain region. The method for fabricating the semiconductor device comprises the steps of doping the semiconductor layer with a dopant of the second conductivity type for the drain region and doping the semiconductor layer with a dopant of the first conductivity type for the buried region. The step of doping the semiconductor layer with the dopant of the first conductivity type includes the steps of forming, on the semiconductor layer, a multilayer resist mask having an opening configured to correspond to the buried region and implanting dopant ions of the first conductivity type into the semiconductor layer via the multilayer resist mask by high-energy ion implantation.

11 Claims, 13 Drawing Sheets

Lw ≧ Tw

US 6,312,996 B1

SEMICONDUCTOR DEVICE AND METHOD FOR FABRICATING THE SAME

BACKGROUND OF THE INVENTION

The present invention generally relates to a semiconductor device and a method for fabricating the same, and more particularly relates to a power MOSFET with a reduced ON-state resistance but with an increased drain-source breakdown voltage and to a method for fabricating the same.

First, a conventional semiconductor device with a structure for increasing a drain-source breakdown voltage will be described with reference to FIG. 10. This semiconductor device is described in Japanese Laid-Open Publication No. 4-107877, which was filed by Matsushita Electronics Corporation.

This device includes: an n-type source region 107 and an n-type extended drain region 103, which are both formed within a p-type silicon substrate 104; and a p-type buried region 102 enclosed in the n-type extended drain region 103. In part of the n-type extended drain region 103, a drain contact region 114 is provided to be in electrical contact with a drain electrode 110. The n-type source region 107, as well as a substrate contact region 108 formed within the surface of the p-type silicon substrate 104, is in electrical contact with a source electrode 111. And an anti-punchthrough region 109 is provided to surround the source region 107 and the substrate contact region 108.

A region between the source region 107 and the extended drain region 103 functions as a channel region. A gate electrode 106 is provided over the surface of the p-type silicon substrate 104 with a gate insulating film interposed therebetween. And the surface of the p-type silicon substrate 104 is covered with a thermal oxide film 105.

This semiconductor device is characterized by including: the n-type extended drain region 103, which is formed by a diffusion process within the p-type silicon substrate 104 to have a relatively low dopant concentration; and the p-type buried region 102 formed inside the n-type extended drain region 103.

FIG. 11 illustrates the distributions of dopant concentrations and the distribution of a carrier concentration in the depth direction, which are both measured along the line X–X' in FIG. 10. In general, the conductivity type of a particular semiconductor region is determined as p- or n-type depending on the result of comparison in concentration between p- and n-type dopants existing in the particular semiconductor region. That is to say, if the concentration of the p-type dopant is higher in that region than that of the n-type dopant, then the conductivity type of the semiconductor region is p-type, and vice versa. It should be noted that the higher the concentration of an n-type dopant, the lower the ON-state resistance of a MOSFET.

Next, the ON- and OFF-state operations of this semiconductor device will be described.

The p-type buried region 102 is reverse-biased relative to the extended drain region 103. Accordingly, while this MOSFET is in its OFF state, a depletion layer expands not only from a pn junction between the p-type buried region 102 and the n-type extended drain region 103, but also from a pn junction between the p-type silicon substrate 104 and the n-type extended drain region 103. By utilizing these depletion layers, the breakdown voltage of this MOSFET can be increased.

On the other hand, while the MOSFET is in its ON state, electrons are moving through the extended drain region 103. More specifically, the electrons are moving through part of the extended drain region 103 near the surface of the p-type silicon substrate 104, where the concentration of the n-type dopant is the highest, and through another part of the extended drain region 103 under the p-type buried region 102. Thus, this structure can decrease the ON-state resistance of the MOSFET with the breakdown voltage thereof increased. However, if the p-type buried region 102 has been formed by an ordinary diffusion process, then the conductivity type of the surface region of the p-type silicon substrate 104, where the concentration of the n-type dopant is usually the highest, is inverted into p-type. As a result, the concentration of n-type carriers decreases and the ON-state resistance increases in that region.

The method disclosed in Japanese Laid-Open Publication No. 4-107877 includes the steps of: forming the extended drain region 103 by implanting dopant ions into the p-type silicon substrate 104 and diffusing the dopant through the p-type silicon substrate 104; implanting boron ions into the extended drain region 103 and then conducting a heat treatment; and thermally oxidizing the surface of the p-type silicon substrate 104. As a result of the final thermal oxidation process step, the concentration of the p-type dopant in the region between the p-type buried region 102 and the surface of the p-type silicon substrate 104 decreases, thus inverting the conductivity type of that region into n-type. During this thermal oxidation process step, the boron ions, existing in the region above the p-type buried region 102, are introduced into the silicon dioxide film 105 by utilizing the difference in coefficient of segregation between silicon and silicon dioxide. As a result of this thermal oxidation, the p-type buried region 102 is located at a distance from the surface of the substrate with the thin n-type region interposed therebetween. That is to say, the p-type buried region 102 is embedded in the extended drain region 103 so to speak. However, in order to invert the conductivity type of the region above the p-type buried region 102 into n-type by decreasing the concentration of boron in that region, a thermal oxide film with a relatively large thickness (e.g., 1 μm or more) should be formed thereon.

In this conventional method, the depth of the p-type buried region 102 from the surface of the substrate and the control over the carrier concentration in the region between the p-type buried region 102 and the surface of the substrate are both dependent on the conditions under which the thermal oxide film 105 is formed. Accordingly, the carrier concentration in that surface region of the extended drain region 103 is affected by a variation in process parameters, including temperature and flow rate of oxygen gas, during the process step of forming the thermal oxide film 105. More specifically, the surface carrier concentration in the extended drain region 103 is very sensitive to, or greatly variable with, a rate at which the thermal oxide film 105 is formed and with the final thickness of the thermal oxide film 105. Accordingly, it is extremely difficult to precisely control the surface carrier concentration of the extended drain region 103 during the thermal oxidation process step.

As shown in FIG. 11, in the surface region of the semiconductor substrate, the concentration of the p-type carriers is only slightly different from that of the n-type carriers. The difference is so small that this delicate concentration balance is easily disturbed by various factors during the fabrication process. For example, if the concentration of the p-type carriers does not sufficiently decrease in that surface region during the formation of the p-type buried region 102, then the conductivity type at the surface of the p-type diffusion layer might not be completely inverted into n-type. Or even if the conductivity type has been successfully inverted into n-type, the concentration of the p-type carriers in the surface region may be greatly variable every time the p-type buried region 102 is formed. Such inconsistent inversion or greatly variable concentration is likely to broaden the range of variation in ON-state resistance (e.g., 1.2 to 2.0Ω per unit area) depending on the current passing through the extended drain region between the gate and drain electrodes, or considerably varies the characteristics of the device.

To reduce this variation, a method shown in FIGS. 12A and 12B may be employed. In the illustrated method, an extended drain region 26 is first formed within a p-type silicon substrate 27, and then boron ions are implanted into the p-type silicon substrate 27 with a relatively high implant energy of 1 to 2 MeV. Specifically, according to this method, a thick resist film 24 with a relatively large thickness of about 3 to about 4 μm is applied onto the surface of the p-type silicon substrate 27 and then exposed to radiation and developed by photolithography to form an opening in the resist film 24. Thereafter, boron ions are implanted with high energy into the p-type silicon substrate 27 through this opening so as to reach a depth of about 1 μm as measured from the surface of the extended drain region 26. As a result, a p-type buried region 28 is formed as shown in FIG. 12B. In accordance with this method, the uniformity of surface concentration in the extended drain region 26 is dependent on how the extended drain region 26 itself is formed. Thus, unlike the prior art described above, the process step of inverting the conductivity type of the p-type surface region into n-type by introducing boron ions into the thermal oxide film is no longer necessary. Consequently, the variation in ON-state resistance of the MOSFET can be reduced.

In order to form the p-type buried region 28 by such high-energy ion implantation, a patterned ion implantation mask such as resist film, metal film or insulating film should be formed on the substrate. Also, each edge of the patterned ion implantation mask is not completely parallel to the direction in which the ions are implanted. Accordingly, in the surface region of the substrate below the edge of the ion implantation mask, the profile of the dopant, which has been implanted into the substrate by high-energy implantation, shifts toward the surface of the substrate. Also, to ensure sufficient blocking effect by the use of the ion implantation mask, the higher the implant energy is, the thicker the mask such as a resist film should be. In addition, to maintain a certain degree of vacuum within an ion implanter, the solvent, water and the like contained in a resist film should be vaporized by heating the semiconductor substrate in advance. However, if the resist film is thick, then the substrate should be heated for a longer time or at a higher temperature than usual. Nevertheless, if the substrate is heated under such a condition, then the edge of the thick resist film 24 is likely to incline and the resist film 24 is likely to have a trapezoidal cross section as shown in FIG. 12B. This is because the deformation of the thick resist film 24 usually results from the shrinkage of part of the resist film 24 that is not in contact with the p-type silicon substrate 27 rather than the other part of the resist film 24 in contact with the p-type silicon substrate 27. If the ions are implanted using such a deformed resist film 24 as a mask, then the thinned part of the resist film 24 at the edge thereof cannot perform the expected masking effect, or cannot sufficiently block the impinging ions. As a result, the dopant ions pass through that part of the resist film 24 to be implanted into a region of the substrate near the surface thereof as shown in FIG. 12B. That is to say, the outer periphery of the buried region 28 protrudes upward, i.e., toward the surface of the substrate, thereby forming a p-type region reaching the surface of the substrate. Such a p-type region, reaching the surface of the substrate, is formed to cross the path of a drain current between the gate region and the drain electrode, thus increasing the ON-state resistance of the device.

SUMMARY OF THE INVENTION

In view of the foregoing, it is therefore an object of the present invention to prevent the resist mask from being deformed during the high-energy implantation of dopant ions into the semiconductor layer and thereby prevent the dopant ions from passing through the thinned portion of the resist mask and being implanted into a near surface region of the semiconductor layer.

To attain the above object, a first method for fabricating a semiconductor device according to the present invention is a method for fabricating a semiconductor device comprising: a semiconductor layer of a first conductivity type; a source region of a second conductivity type formed within the semiconductor layer; a drain region of the second conductivity type formed within the semiconductor layer; a channel region provided between the source and drain regions; a gate electrode formed over the channel region; and a buried region of the first conductivity type having at least a part included in the drain region, the method comprising the steps of: doping the semiconductor layer with a dopant of the second conductivity type for the drain region; and doping the semiconductor layer with a dopant of the first conductivity type for the buried region, the step of doping the semiconductor layer with the dopant of the first conductivity type including the steps of: forming, on the semiconductor layer, a multilayer resist mask having an opening configured to correspond to the buried region; and implanting ions of the dopant of the first conductivity type into the semiconductor layer via the multilayer resist mask by high-energy ion implantation.

In accordance with the first method for fabricating a semiconductor device of the present invention, the dopant ions of the first conductivity type are implanted into the semiconductor layer via the multi-layer resist mask so that the deformation of the resist mask after exposure and development is prevented. This prevents the dopant ions from passing through the thinned portion of the resist mask and being implanted into the near-surface region of the semiconductor layer.

In the first method of the present invention, the step of doping the semiconductor layer with the dopant of the first conductivity type is preferably performed by using boron ions as the ions of the dopant of the first conductivity type under implant conditions in which a doze ranges from $1 \times 10^{13}$ cm$^{-2}$ to $3 \times 10^{13}$ cm$^{-2}$ and an implant energy ranges from 1 MeV to 2 MeV.

By thus effecting high-energy ion implantation under a condition in which the implant energy ranges from 1 MeV to 2 MeV, the boron ions are implanted into an inner portion of the drain region at a specified distance or farther away from the surface thereof and prevented from passing through the multilayer resist mask.

In the first method of the present invention, the multilayer resist mask preferably has a thickness ranging from 3 μm to 5 μm.

With the arrangement, even when the ions of the dopant of the first conductivity type are implanted by high-energy ion implantation, the dopant ions are prevented from passing through the multilayer resist mask.

A second method for fabricating a semiconductor device according to the present invention is a method for fabricating a semiconductor device comprising: a semiconductor layer of a first conductivity type; a source region of a second conductivity type formed within the semiconductor layer; a drain region of the second conductivity type formed within the semiconductor layer; a channel region provided between the source and drain regions; a gate electrode formed over the channel region; and a buried region of the first conductivity type having at least a part included in the drain region, the method comprising the steps of: doping the semiconductor layer with a dopant of the second conductivity type for the drain region; and doping the semiconductor layer with a dopant of the first conductivity type for the buried region, the step of doping the semiconductor layer with the dopant of the first conductivity type including the steps of: forming, on the semiconductor layer, a multilayer resist mask having an opening configured to correspond to the buried region and composed of a plurality of stacked resist layers each having a thickness ranging from 1 $\mu$m to 1.2 $\mu$m; and implanting ions of the dopant of the first conductivity type into the semiconductor layer via the multilayer resist mask by high-energy ion implantation.

In accordance with the second method for fabricating a semiconductor device of the present invention, the dopant ions of the first conductivity type are implanted into the semiconductor layer via the multi-layer resist mask so that the deformation of the resist mask after exposure and development is prevented. This prevents the dopant ions from passing through the thinned portion of the resist mask and being implanted into the near-surface region of the semiconductor layer.

The arrangement prevents an increase in the number of process steps resulting from an increased number of stacked resist layers to provide the multilayer resist films each having a desired thickness. The arrangement also prevents thickness variations in the multilayer resist mask resulting from thickness variations in the resist films.

In the second method of the present invention, the step of forming the multilayer resist mask preferably includes the steps of: forming the plurality of resist layers by spin coating; performing a first heat treatment at a first temperature with respect to each of the plurality of resist layers; and performing a second heat treatment at a second temperature equal to or higher than the first temperature with respect to each of the plurality of resist layers.

Thus, the solvent or water contained in each of the resist layers can reliably be removed by performing the first heat treatment at the first temperature with respect to each of the plurality of resist layers and the second heat treatment at the second temperature equal to or higher than the first temperature with respect thereto. In addition, there can be suppressed an increase in the time required to remove the solvent or water from each of the resist layers.

In this case, the first temperature is preferably 110° C. or lower and the second temperature preferably ranges from 110° C. to 130° C.

The arrangement further ensures the removal of the solvent or water contained in each of the resist layers as well as the suppression of an increase in the time required to remove the solvent or water from each of the resist layers.

In the second method for fabricating a semiconductor device, the step of forming the multilayer resist mask preferably includes the step of heating the plurality of stacked resist layers at a temperature of 100° C. or lower after exposing and developing the resist layers.

By thus performing the heat treatment at a temperature of 100° C. or lower after development, it is possible to remove the water penetrated into the multilayer resist pattern during the development step and prevent the edges of the opening of the multilayer resist mask from being inclined.

In the second method for fabricating a semiconductor device, each of the plurality of resist layers is preferably formed by applying a resist solution having a viscosity of 20 cp to 25 cp.

By thus forming the resist layer by applying the resist solution with a low viscosity, the resist layer having a thickness of 1 $\mu$m to 1.2 $\mu$m can reliably be formed.

A third method for fabricating a semiconductor device according to the present invention is a method for fabricating a semiconductor device comprising: a semiconductor layer of a first conductivity type; a source region of a second conductivity type formed within the semiconductor layer; a drain region of the second conductivity type formed within the semiconductor layer; a channel region provided between the source and drain regions; a gate electrode formed over the channel region; and a buried region of the first conductivity type having at least a part included in the drain region, the method comprising the steps of: doping the semiconductor layer with a dopant of the second conductivity type for the drain region; doping the semiconductor layer with a dopant of the first conductivity type for the buried region; and doping the semiconductor layer with the dopant of the second conductivity type to form a heavily doped region of the second conductivity type between a surface of the semiconductor layer and the buried region.

In accordance with the third method for fabricating a semiconductor device, the ON-state resistance of the MOSFET composed of the source region, the drain region, the channel region, and the gate electrode can be reduced.

In the third method for fabricating a semiconductor device, the heavily doped region preferably has a thickness of 0.5 $\mu$m or more. The arrangement surely reduces the ON-state resistance of the MOSFET.

In the third method for fabricating a semiconductor device, the heavily doped region preferably has a dopant concentration of 1—$10^{17}$ cm$^{-3}$ or higher. The arrangement surely reduces the ON-state resistance of the MOSFET.

BRIEF DESCRIPTION OF THE DRAWINGS

FIGS. 9A to 9D are cross-sectional views illustrating process steps of still another embodiment of the method for fabricating a semiconductor device according to the present invention;

DESCRIPTION OF THE PREFERRED EMBODIMENTS

Embodiment 1

Figure 1A:
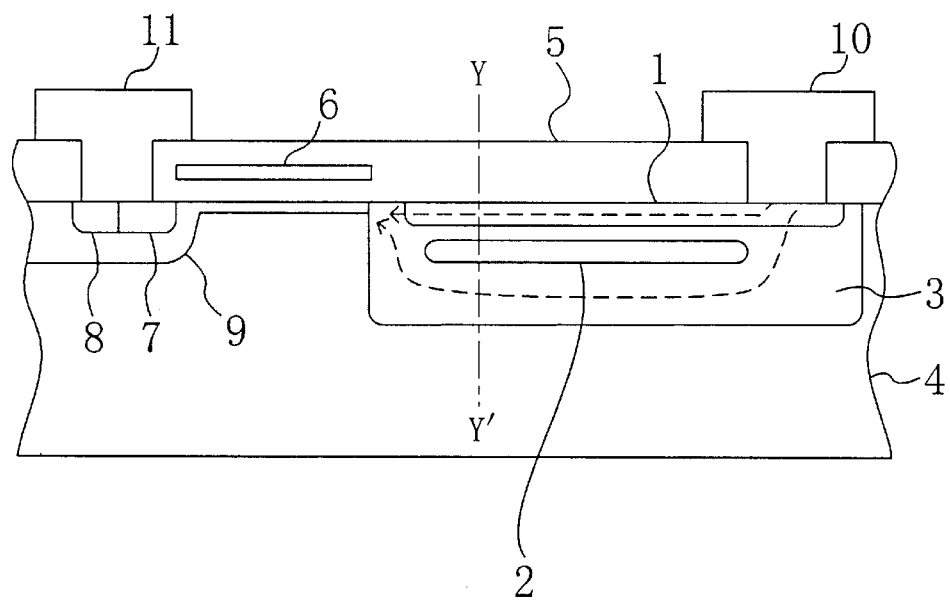
FIG. 1A is a cross-sectional view illustrating a first exemplary embodiment of a semiconductor device according to the present invention.
Figure 1B:
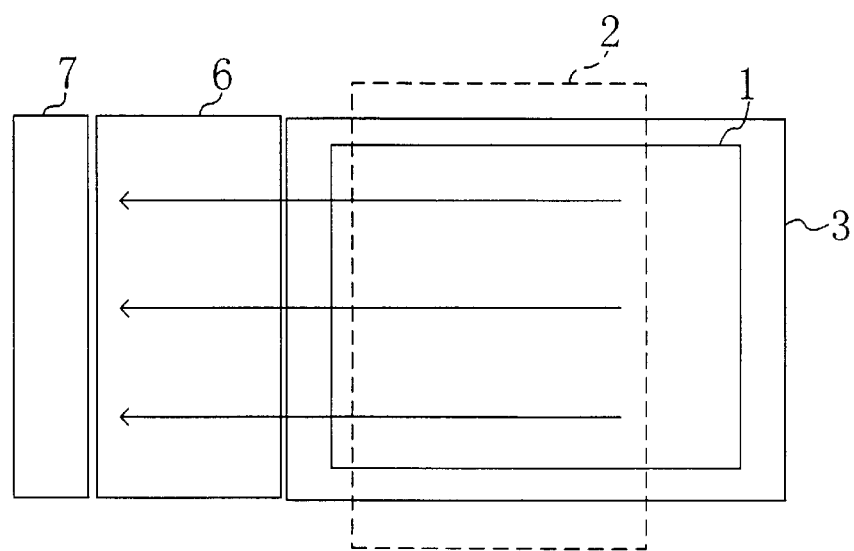
FIG. 1B is a plan view illustrating a planar layout thereof.

Hereinafter, a first exemplary embodiment of a semiconductor device according to the present invention will be described with reference to FIGS. 1A and 1B. FIG. 1A illustrates a cross-sectional structure of a semiconductor device of this embodiment; and FIG. 1B illustrates a planar layout for several components of the semiconductor device.

This semiconductor device has a lateral MOSFET structure formed in a p-type single crystalline silicon substrate (hereinafter referred to as the p-type silicon substrate) 4 with the concentration of a p-type dopant defined within the range from about $1\times10^{14}$ cm$^{-3}$ to about $3\times10^{14}$ cm$^{-3}$. More specifically, the semiconductor device includes: n-type source region 7 and n-type extended drain region (may also be called simply "drain region") 3, which are formed within the p-type silicon substrate 4; and a p-type buried region 2 substantially surrounded by the n-type extended drain region 3. In this embodiment, the n-type source region 7 is placed adjacent to a p-type substrate contact region 8 formed within the surface of the p-type silicon substrate 4. The n-type source region 7 and the p-type substrate contact region 8 are both in contact with a source electrode 11. As shown in FIG. 1B, the p-type buried region 2 may be extended outward from the edges of the n-type extended drain region 3 to be electrically connected to the p-type silicon substrate 4. It should be noted that the electrical connection between the p-type buried region 2 and the p-type silicon substrate 4 is not limited to that exemplified in FIG. 1B. Alternatively, at least part of the p-type buried region 2 may extend outward (i.e., inside the p-type silicon substrate 4) from the n-type extended drain region 3. However, it is not preferable for the p-type buried region 2 to extend toward the channel region.

In this embodiment, the surface concentration of an n-type dopant in the n-type extended drain region 3 is defined within the range from about $1\times10^{16}$ cm$^{-3}$ to about $1\times10^{17}$ cm$^{-3}$. The thickness of the n-type extended drain region 3 is in the range from about 6 μm to about 7 μm. The p-type buried region 2 is formed at a depth of about 1 μm to about 1.5 μm within the p-type silicon substrate 4 as measured from the surface thereof. The thickness of the p-type buried region 2 is in the range from about 0.8 μm to about 1.2 μm.

This semiconductor device is characterized by further including an n-type heavily doped region (thickness: from about 0.5 μm to about 1 μm) 1 between the surface of the p-type silicon substrate 4 and the p-type buried region 2. So long as the n-type heavily doped region 1 is located above the p-type buried region 2, the n-type heavily doped region 1 may be either separated from the p-type buried region 2 as shown in FIG. 1A or in contact with the p-type buried region 2. In this embodiment, to define the sheet resistance of the n-type heavily doped region 1 within the range from about 0.8 Ω/□ to about 1.0 Ω/□, the doping level of the n-type dopant is adjusted such that the surface concentration of the n-type dopant falls within the range from $1\times10^{17}$ cm$^{-3}$ to about $1\times10^{18}$ cm$^{-3}$. The surface concentration of the n-type dopant in the n-type heavily doped region 1 is appropriately determined depending on the ON-state resistance required for a MOSFET to operate properly. To reduce the ON-state resistance, the surface concentration of the n-type dopant in the n-type heavily doped region 1 is preferably high and the n-type heavily doped region 1 should be thick.

The region between the source region 7 and the extended drain region 3 functions as a channel region. The source region 7 and the substrate contact region 8 are formed in an anti-punchthrough region 9 lightly doped with a p-type dopant. A gate electrode 6 is formed over the channel region of the p-type silicon substrate 4 with a gate insulating film interposed therebetween. An insulating film (thickness: from about 1 μm to about 2 μm) 5 is formed over the p-type silicon substrate 4 to cover the gate electrode 6.

The n-type heavily doped region 1 shown in FIGS. 1A and 1B covers an area from above one side through the other of the buried region 2 in the direction in which the extended drain region 3 extends. In other words, the n-type heavily doped region 1 expands over the right- and left-hand edges of the buried region 2 shown in FIG. 1A outward, or right- and leftward. In this embodiment, part of the n-type heavily doped region 1 is directly in contact with the drain electrode 10. Thus, no drain contact region is formed for that purpose. Even so, if the n-type heavily doped region 1 has a dopant concentration approximately equal to that of an ordinary drain contact region, a sufficiently low contact resistance is attained.

While the MOSFET is in the ON state, the current flows through the n-type heavily doped region 1 and the extended drain region 3 toward the source region 7 as indicated by the dashed arrows in FIG. 1A and the solid ones in FIG. 1B.

Figure 2:
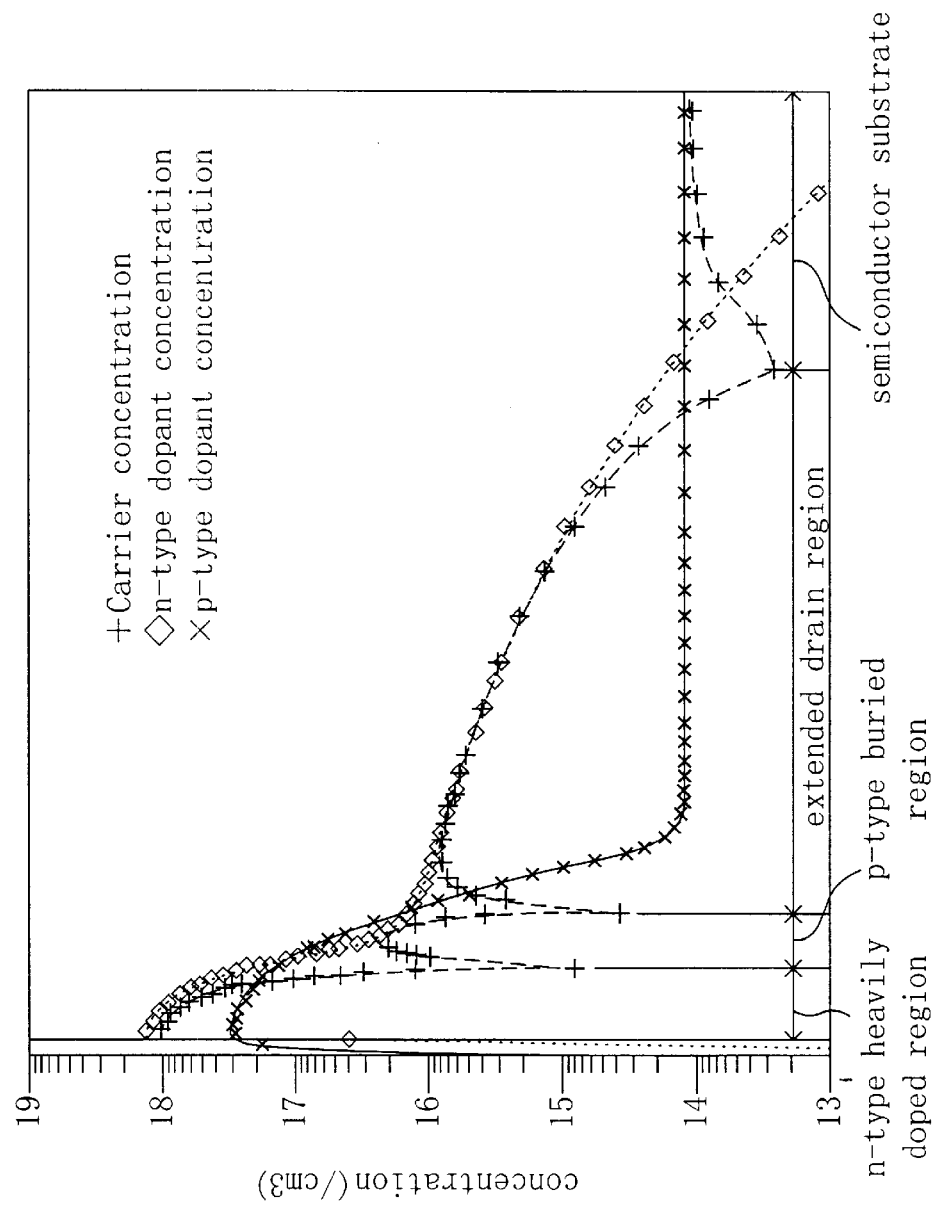
FIG. 2 is a graph illustrating profiles of respective dopants as measured in the depth direction along the line Y–Y' in FIG. 1.
Figure 11:
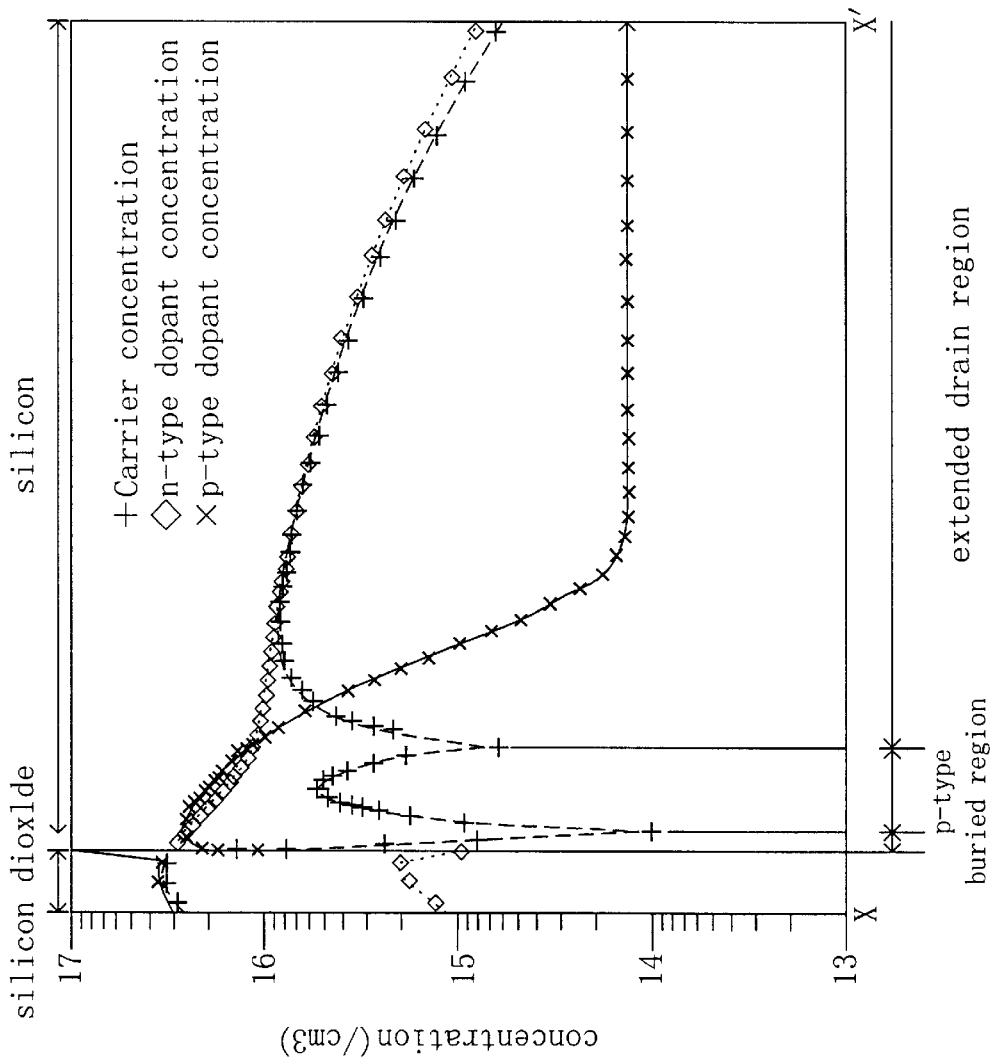
FIG. 11 is a graph showing a profile of dopant concentration in the direction of depth along the line X–X' of FIG. 10.

FIG. 2 illustrates profiles of respective dopants as measured in the depth direction along the line Y–Y' in FIG. 1. As can be seen from FIG. 2, the concentration of the n-type dopant in the heavily doped region 1 formed between the surface of the p-type silicon substrate 4 and the buried region 2 is higher than that of the n-type dopant in the conventional extended drain region (see FIG. 11). Accordingly, the existence of the n-type heavily doped region 1 can reduce the ON-state resistance of the MOSFET. Also, the concentration of the n-type dopant in the upper part (i.e., closer to the surface of the substrate) of the extended drain region 3 is much higher than that of the p-type dopant in that part. Thus, the ON-state resistance of the transistor neither increases nor greatly changes due to the variation of parameters during the fabrication process thereof.

Figure 10:
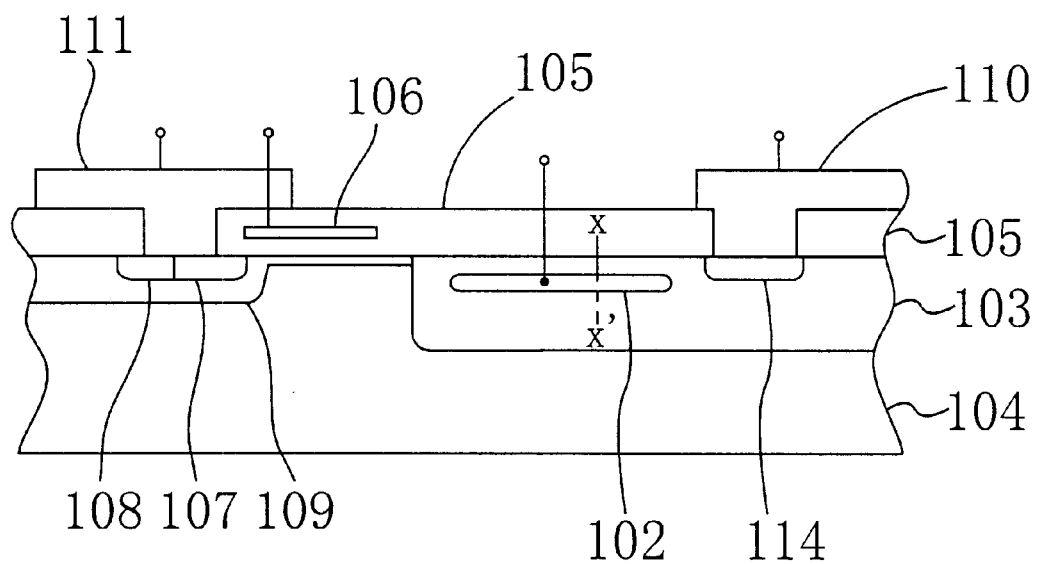
FIG. 10 is a cross-sectional view of a conventional semiconductor device having a buried region within an extended drain region.

If the p-type buried region is formed inside the n-type extended drain region 3, n- and p-type dopants both exist between the buried region and the surface of the semiconductor substrate. In the conventional semiconductor device shown in FIG. 10, an inversion layer might be formed in the upper part of the n-type extended drain region to disrupt the path of drain current. In contrast, in the device of this embodiment, the n-type heavily doped region 1 specially provided can greatly reduce the resistance as compared with the conventional structure.

Hereinafter, an exemplary method for fabricating the semiconductor device according to the present invention will be described with reference to FIGS. 3A, 3B, 3C, 3D, 3E, 3F, 3G and 3H. FIGS. 3A, 3B, 3C and 3D illustrate respective cross sections of the device at principal steps of the fabrication process. FIGS. 3E, 3F, 3G and 3H illustrate planar layouts of the device corresponding to the respective process steps shown in FIGS. 3A, 3B, 3C and 3D.

Figure 3A:
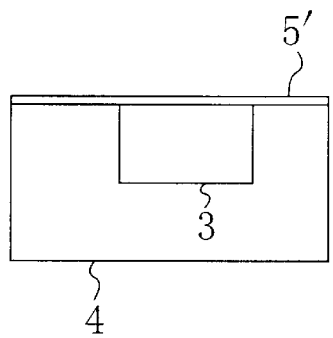
FIGS. 3A, 3B, 3C and 3D are cross-sectional views illustrating principal process steps of a first exemplary method for fabricating a semiconductor device according to the present invention.
Figure 3E:
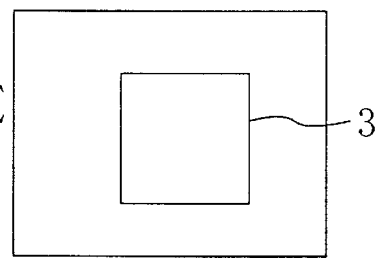
FIGS. 3E, 3F, 3G and 3H are plan views illustrating planar layouts corresponding to the respective process steps shown in FIGS. 3A, 3B, 3C and 3D.

First, as shown in FIGS. 3A and 3E, the n-type extended drain region 3 is formed within the p-type silicon substrate 4. The extended drain region 3 may be formed by an ordinary thermal diffusion process. In this process step, the surface of the p-type silicon substrate 4 is covered with an insulating film 5'.

Figure 3B:
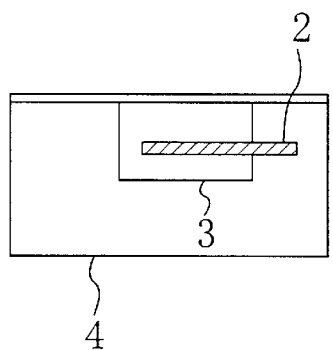
Figure 3F:
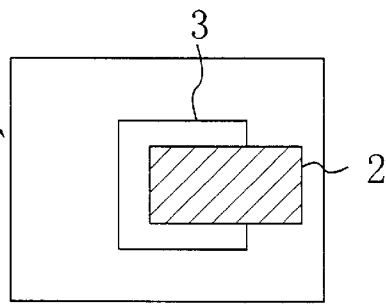

Next, as shown in FIGS. 3B and 3F, the p-type buried region 2 is formed within the p-type silicon substrate 4 by high-energy ion implantation. Most of the p-type buried region 2 is covered with the extended drain region 3, but one end of the p-type buried region 2 extends outward from the extended drain region 3 to come into electrical contact with the p-type silicon substrate 4. Unlike the arrangement shown in FIGS. 1A and 1B, one end of the p-type buried region 2 protrudes in this embodiment in the direction opposite to the direction in which the current flows within the drain region.

Figure 3C:
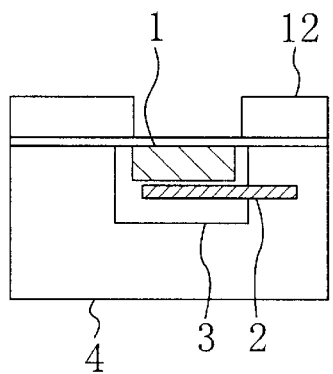
Figure 3G:
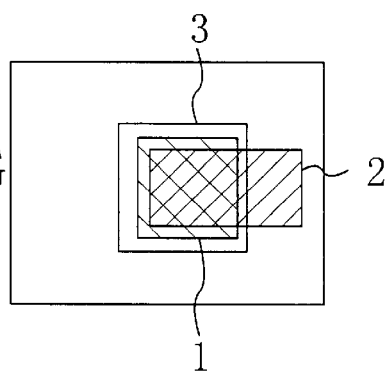

Subsequently, as shown in FIGS. 3C and 3G, the surface of the p-type silicon substrate 4 is partially covered with a resist mask 12 and then n-type dopant ions are implanted into the p-type silicon substrate 4 to form the n-type heavily doped region 1. When the heavily doped region 1 is formed by a doping technique as is done in this embodiment, the dopant concentration and the thickness of the heavily doped region 1 can be designed very flexibly. In the semiconductor device shown in FIG. 10, the thickness of the n-type layer between the surface of the semiconductor substrate and the buried region is smaller than 0.5 $\mu$m. In accordance with the conventional method for fabricating the device shown in FIG. 10, it is difficult to increase the thickness of this n-type layer up to 0.5 $\mu$m or more. Thus, the resistance in the surface region of the extended drain region cannot be sufficiently reduced. In contrast, according to the method of this embodiment, the resistance in the surface region can be reduced easily.

Figure 3D:
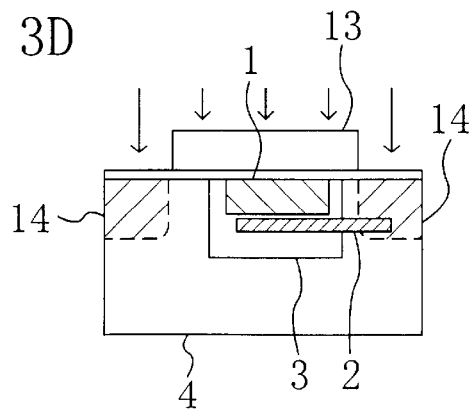
Figure 3H:
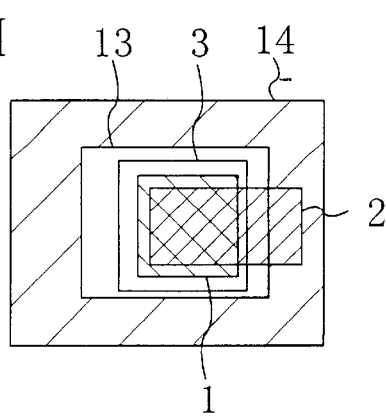

Thereafter, as shown in FIGS. 3D and 3H, the surface of the p-type semiconductor substrate 4 is partially covered with a resist mask 13 and then p-type dopant ions are implanted into the p-type silicon substrate 4 at a dose of $1 \times 10^{15}$ cm$^{-2}$ and with an implant energy of 100 keV, thereby forming channel stop regions (including anti-punchthrough regions) 14. One end of the p-type buried region 2 is connected to the channel stop region 14. Since the dopant concentration in the p-type buried region 2 is set relatively low to increase the breakdown voltage of the device, the contact resistance between the p-type buried region 2 and the p-type silicon substrate 4 becomes relatively high. Accordingly, by setting the dopant concentration in the channel stop regions 14 relatively high, the contact resistance between the p-type buried region 2 and the channel stop regions 14 is reduced. As a result, the substrate potential can be supplied efficiently to the p-type buried region 2 through the channel stop regions 14. In order to reduce the electrical connection resistance of the device, the concentration of the p-type dopant in the channel stop regions 14 is preferably higher than that in the p-type buried region 2.

Figure 4:
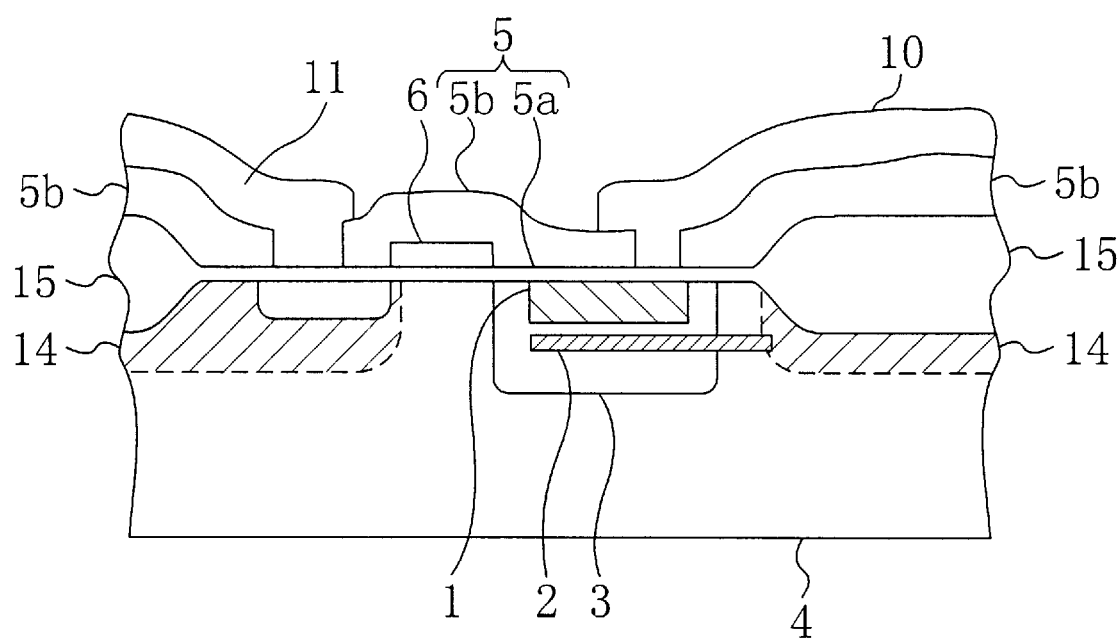
FIG. 4 is a cross-sectional view of a semiconductor device fabricated by the method of the present invention.

The semiconductor device shown in FIG. 4 is obtained by performing known process steps for fabricating a semiconductor device after the channel stop regions 14 have been formed. The device shown in FIG. 4 includes LOCOS regions 15 as a field oxide. In the example shown in FIG. 4, the LOCOS regions 15 are included within the channel stop regions 14. Alternatively, the LOCOS regions 15 may or may not cover the extended drain region 3. Source 7, channel and drain contact regions are formed in respective parts of the channel stop regions 14 that are not occupied by the LOCOS regions 15. In this embodiment, part of the heavily doped region 1 functions as an alternative drain contact region. Also, part of the channel stop region 14 that surrounds the source region 7 functions as the anti-punchthrough region (i.e., the region 9 shown in FIG. 1A). The gate electrode 6 is formed on a gate insulating film 5a and is covered with an interlevel dielectric film 5b. Drain and source electrodes 10 and 11 are formed on the interlevel dielectric film 5b.

FIGS. 5A, 5B, 5C and 5D illustrate exemplary planar layouts for principal components of the semiconductor device according to the present invention. In these drawings, exemplary positional relationships among the n-type heavily doped region 1, p-type buried region 2, extended drain region 3 and gate electrode 6 are illustrated, and the arrows indicate respective current paths. In the area where the buried region 2 is formed, the thickness of the extended drain region 3 is the sum of thicknesses of respective parts of the extended drain region 3 over and under the buried region 2 (see FIG. 1A). Accordingly, the extended drain region 3 is relatively thick in the area where the buried region 2 is not formed, but relatively thin in the area where the buried region 2 is formed. That is to say, since the thickness of the extended drain region 3 at a position is different from that at another position, the sheet resistance of the extended drain region 3 is also variable within this region. In general, current is more likely to flow through a region where the sheet resistance is low. Accordingly, the current tends to flow preferentially through the n-type heavily doped region 1 as indicated by the arrows in FIGS. 5A through 5D.

Figure 5A:
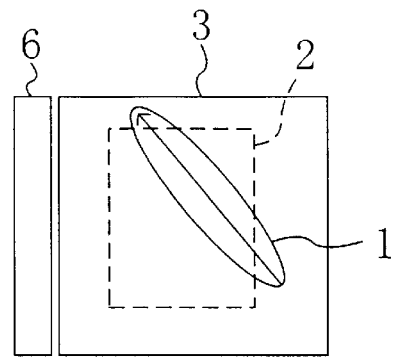
FIGS. 5A, 5B, 5C and 5D are plan views illustrating exemplary layouts for principal components of the semiconductor device according to the present invention.

In FIG. 5A, the n-type heavily doped region 1 extends from part of the extended drain region 3 where the p-type buried region 2 does not exist and obliquely crosses over part of the buried region 2 to reach another part of the extended drain region 3 where the buried region 2 does not exist. In other words, the n-type heavily doped region 1 passes through part of the extended drain region 3 with an increased sheet resistance due to the existence of the buried region 2 to interconnect other parts of the extended drain region 3 with a relatively low sheet resistance. Accordingly, even if the density of n-type carriers has decreased between the surface of the substrate and the p-type buried region 2 due to the existence of the p-type carriers implanted to form the p-type buried region 2, the increase in ON-state resistance can be suppressed. This is because the n-type heavily doped region 1 provides a current path with a low resistance.

Figure 5B:
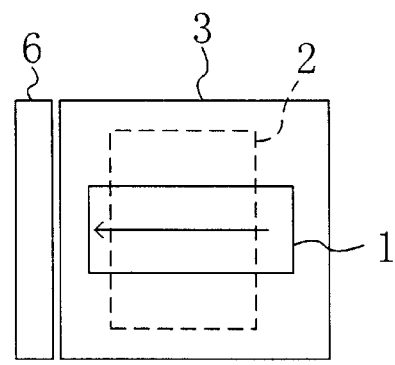
Figure 5C:
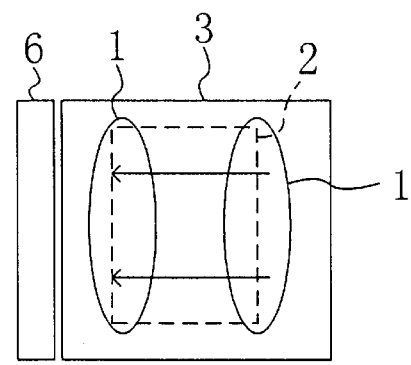

The exemplary locations of the n-type heavily doped region 1 shown in FIGS. 5B and 5C can further reduce the ON-state resistance. In the example shown in FIG. 5B, the n-type heavily doped region 1 extends from the drain contact region toward the gate electrode 6 in the direction in which the extended drain region 3 extends. The "drain contact region" herein means a region where the extended drain region 3 is in contact with the drain electrode 10 (see FIG. 4). Optionally, the drain contact region may be an additional n-type heavily doped region provided separately from the n-type heavily doped region 1. In the drain region, the current flows smoothly from the drain contact region toward the channel region, resulting in a further reduced ON-state resistance. In the example shown in FIG. 5C, the n-type heavily doped regions 1 are provided to cover the regions where the current paths intersect the buried region 2. Accordingly, a p-type region 80 shown in FIG. 6B (described later) does not intersect the current paths. In the example shown in FIG. 5D, the n-type heavily doped region 1 entirely overlaps the p-type buried region 2. In such a case, the ON-state resistance can be further reduced. It should be noted that FIG. 1A illustrates the cross section of the device with the arrangement shown in FIG. 5D.

Figure 5D:
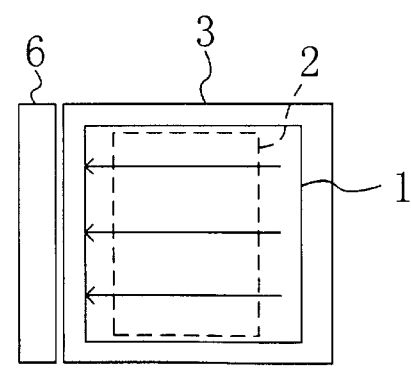

So long as the n-type heavily doped region 1 is formed in at least part of the region between the p-type buried region 2 and the surface of the substrate, the n-type heavily doped region 1 can contribute to the reduction of the ON-state resistance. However, the larger the area of the n-type heavily doped region 1 is, the lower the ON-state resistance can be. Accordingly, the layout shown in FIG. 5D is more suitable to the reduction of the ON-state resistance than the layouts shown in FIGS. 5A through 5C.

Hereinafter, the principal steps of the inventive fabrication process in which the p-type buried region 2 is formed by high-energy ion implantation will be described in more detail with reference to FIGS. 6A, 6B, 6C, 6D and 6E.

Figure 6A:
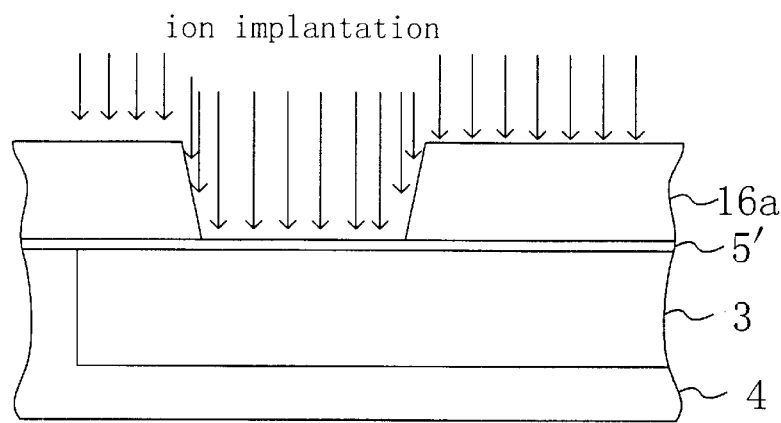
FIGS. 6A, 6B, 6C, 6D and 6E are cross-sectional views illustrating principal process steps of the first method according to the present invention where a p-type buried region is formed by high-energy ion implantation.
Figure 6B:
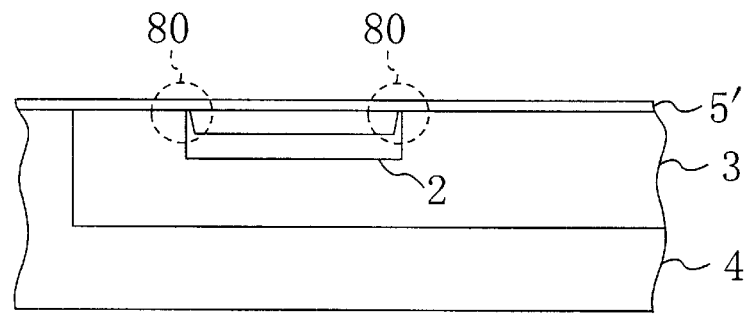
Figure 6C:
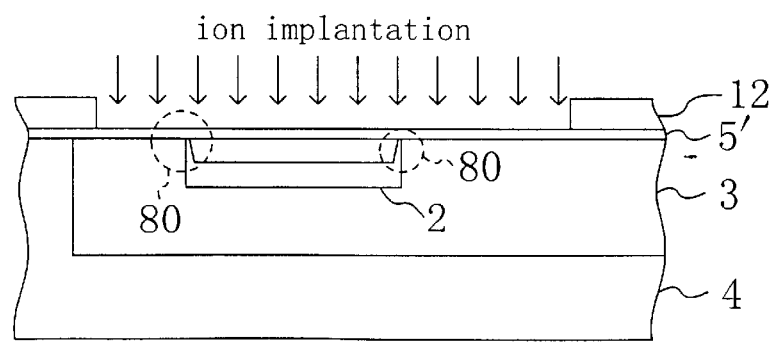

First, as shown in FIG. 6A, a particular region of the p-type silicon substrate 4 is doped with an n-type dopant, thereby forming the n-type extended drain region 3 in the p-type silicon substrate 4. Next, an oxide film 5' is formed on the surface of the p-type silicon substrate 4 and then the surface of the p-type silicon substrate 4 is covered with a thick resist film (thickness: from 3 $\mu$m to 5 $\mu$m) 16a by a photolithographic technique. This thick resist film 16a has an opening defining the shape and location of the buried region to be formed. Then, boron ions are implanted through this opening into the p-type silicon substrate 4 at a dose of about $1 \times 10^{13}$ cm$^{-2}$ to about $3 \times 10^{13}$ cm$^{-2}$ and with a high energy of 1 MeV to 2 MeV.

By effecting high-energy ion implantation, the boron ions implanted reach a depth of about 1 $\mu$m as measured from the surface of the extended drain region 3. Thereafter, to activate these boron ions, a heat treatment is conducted at a temperature from about 900° C. to about 1000° C., thereby forming the p-type buried region 2.

When a relatively thick resist film is formed to perform the high-energy ion implantation, the solvent and water contained in the resist film are vaporized in advance by heating to maintain a sufficient degree of vacuum within the ion implanter during the implantation process. However, since the resist film is deformed due to this pre-heating, the dopant ions penetrate part of the resist film during the ion implantation process. Accordingly, the p-type regions 80 are formed to cover the areas indicated by the dashed circles in FIG. 6B. If such p-type regions 80 are left to intersect the current paths, then the ON-state resistance cannot be reduced as expected.

Figure 6D:
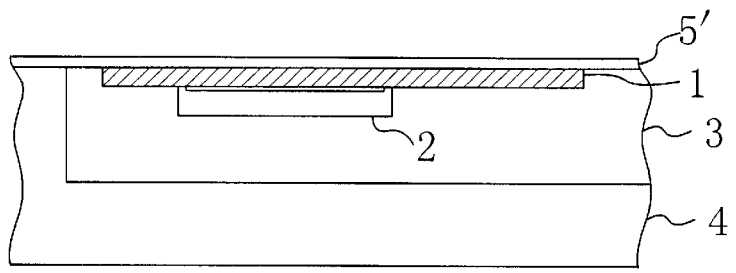

Subsequently, the surface of the substrate is covered with a resist film (thickness: about 1 $\mu$m to about 2 $\mu$m) 12 and then n-type dopant ions (e.g., phosphorus or arsenic ions) are implanted into the surface of the extended drain region 3, thereby changing the conductivity type of the surface region, including the p-type regions 80, into n-type. As a result, the p-type regions 80 disappear. In this process step, the implant dose is preferably defined at $1 \times 10^{13}$ cm$^{-2}$ or more and the implant energy is preferably selected within the range from about 30 keV to about 80 keV. If the ON-state resistance of the MOSFET should be further reduced, then an n-type dopant should be implanted at a higher dose into a wider surface area of the extended drain region 3 to increase the overall density of n-type carriers. FIG. 6D illustrates a state where the n-type heavily doped region 1 has been formed to overlap the p-type buried region 2.

Figure 6E:
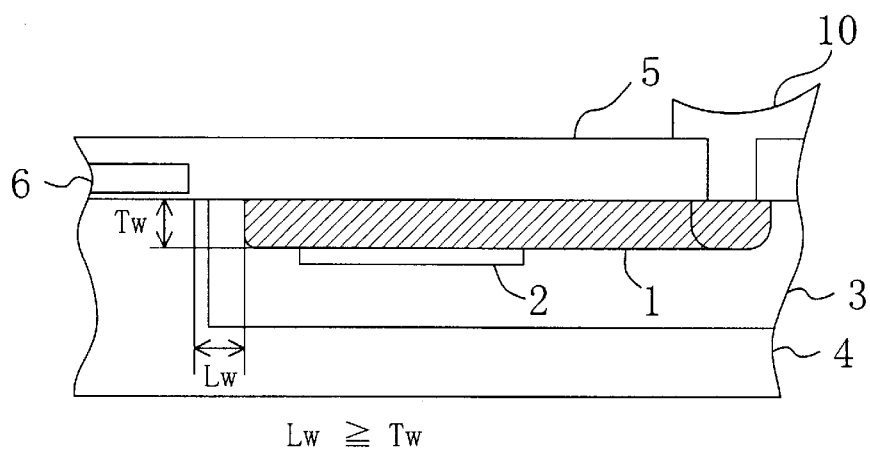

In FIG. 6E, a relatively thick n-type heavily doped region 1 has been formed so that the lower surface of the n-type heavily doped region 1 comes into contact with the upper surface of the p-type buried region 2. In other words, no lightly doped region exists between the n-type heavily doped region 1 and the p-type buried region 2 in the exemplary structure shown in FIG. 6E.

It should be noted that the n-type heavily doped region 1 may be formed by any technique other than ion implantation. Alternatively, the n-type heavily doped region 1 can be formed easily by applying or depositing a dopant source in the liquid or solid state onto the surface of the substrate. For example, a dopant may be diffused using a dopant source of POCl$_3$.

It should be noted that the n-type heavily doped region 1 is separated at a distance Lw from a point on the outer peripheral edge of the extended drain region 3 closer to the channel region. In order to increase the breakdown voltage by utilizing the depletion layers, the distance Lw should preferably be equal to or larger than the thickness Tw of the n-type heavily doped region 1 (i.e., Lw$\geq$Tw).

Embodiment 2

Figure 7A:
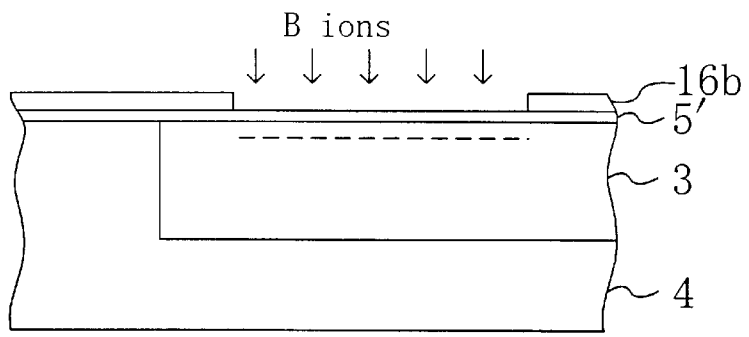
FIGS. 7A, 7B and 7C are cross-sectional views illustrating principal process steps of a second exemplary method according to the present invention where the p-type buried region is formed by a process other than high-energy ion implantation.

Hereinafter, an alternative embodiment of the method for fabricating a semiconductor device according to the present invention will be described with reference to FIGS. 7A, 7B and 7C. In this alternative embodiment, the p-type buried region 2 is formed by a technique other than the high-energy ion implantation. Accordingly, the adverse effects resulting from the deformation of the resist film during the high-energy ion implantation can be eliminated and complicated process steps are not required.

First, the extended drain region 3 is formed within the p-type silicon substrate 4 by performing known fabrication process steps. Thereafter, as shown in FIG. 7A, the surface of the p-type silicon substrate 4 is covered with a resist film 16b and boron ions are implanted at a dose of about $1 \times 10^{13}$ cm$^{-2}$ to about $3 \times 10^{13}$ cm$^{-2}$ and with an implant energy of 30 keV to 80 keV. When the implant energy is defined at such a value, the impinging ions can be sufficiently blocked by the resist film 16b, even though the thickness of the resist film 16b is as small as about 1 $\mu$m to about 1.5 $\mu$m. Since the boron ions are implanted with such relatively low energy, the peak of profile of the implanted boron in the depth direction is located at a position closer to the surface of the substrate. As a result, the conductivity type of the n-type surface region of the substrate, which has been implanted with boron, is inverted into p-type.

Figure 7B:
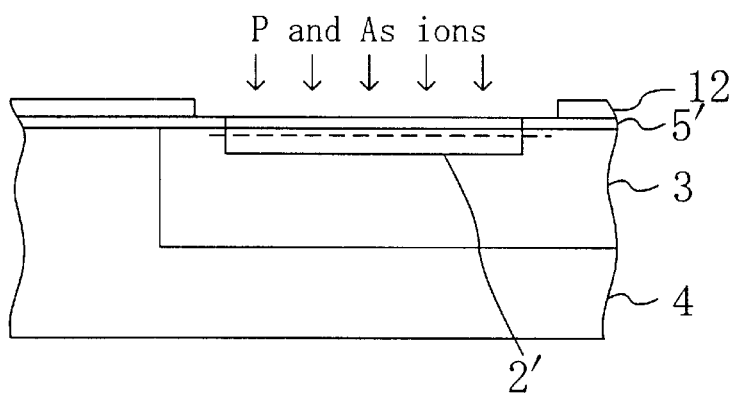
Figure 7C:
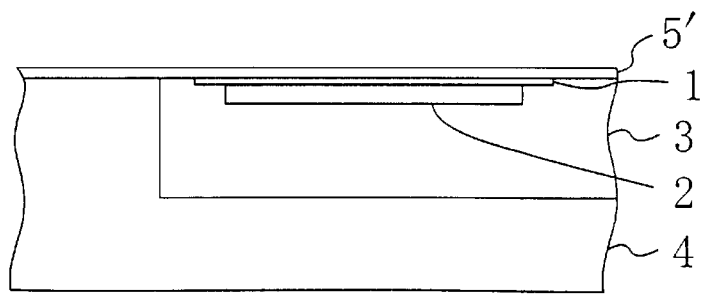

Next, as shown in FIG. 7B, the surface of the p-type silicon substrate 4 is covered with a resist film (thickness: about 1 $\mu$m to about 2 $\mu$m) 12, and then n-type dopant ions (e.g., phosphorus or arsenic ions) are implanted into the p-type silicon substrate 4 at a dose of $1 \times 10^{13}$ cm$^{-2}$ or more and with an implant energy of about 30 keV to about 50 keV. If the ON-state resistance of the MOSFET should be greatly reduced, the density of n-type carriers in the surface region of the substrate should be increased as a whole. In order to reduce the ON-state resistance of the MOSFET effectively, the n-type dopant ions should preferably be implanted into a wide area entirely overlapping the p-type buried region 2 as shown in FIG. 7B. FIG. 7C illustrates a state where the p-type region 2 has been buried by the formation of the n-type heavily doped region 1.

As in the first embodiment described above, the n-type heavily doped region 1 may be formed in the surface region by any technique other than the ion implantation. For example, the heavily doped region may be formed easily by applying or depositing a dopant source in the liquid or solid state.

In the foregoing first and second embodiments, a doped region such as the extended drain region is formed within a semiconductor substrate. However, the present invention is not limited to such specific embodiments in any way. For example, the respective doped layers may be formed within a semiconductor layer, which is either epitaxially grown on a semiconductor substrate or deposited on an insulating layer.

It should be noted that the order, in which the above-described process steps of: doping a semiconductor layer with a dopant of a second conductivity type for an extended drain region; doping the semiconductor layer with a dopant of a first conductivity type for a buried region; and forming a heavily doped region of the second conductivity type at least between the surface of the semiconductor layer and the buried region by further doping the semiconductor layer with a dopant of the second conductivity type, is interchangeable.

Embodiment 3

Hereinafter, another embodiment of the method for fabricating a semiconductor device according to the present invention will be described with reference to FIGS. 8A to 8D and FIGS. 9A to 9C.

Figure 8A:
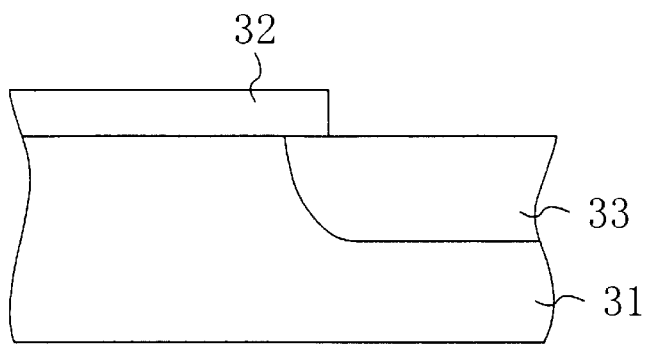
FIGS. 8A to 8D are cross-sectional views illustrating process steps of another embodiment of the method for fabricating a semiconductor device according to the present invention.

First, as shown in FIG. 8A, an implantation mask 32 is formed on a p-type silicon substrate 31. Then, phosphorus ions are implanted into a p-type silicon substrate 31 at a dose of $6 \times 10^{12}$ cm$^{-2}$ and with an implant energy of 150 keV. After the implantation mask 32 is removed, a thermal diffusion (drive-in) process is performed at 1200° C. for about 6 hours. As a result, an extended drain region 33 is formed in a predetermined region of the p-type silicon substrate 31. The extended drain region 33 has a sufficiently large diffusion depth (e.g., 6.0 μm to 7.0 μm) for a p-type buried region 37 to be formed in the inside thereof, which will be described later.

Figure 8B:
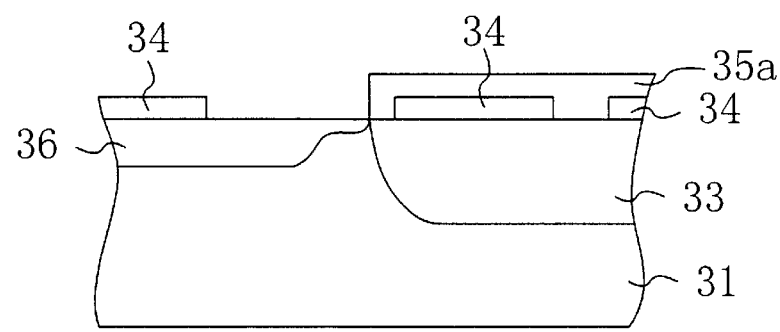

Next, as shown in FIG. 8B, the extended drain region 33 is covered with a resist mask 35a. Then, boron ions are implanted into the peripheral region of the extended drain region 33 at a dose of $3 \times 10^{12}$ cm$^{-2}$ and with an implant energy of 150 keV. After the resist mask 35a is removed, the exposed surface of the p-type silicon substrate 31 is thermally oxidized to form LOCOS regions 34 (thickness: about 1 μm) in predetermined regions of th p-type silicon substrate 31. In the thermal oxidation process, the boron ions implanted in the peripheral region of the extended drain region 33 are diffused to form an anti-punchthrough region 36. The anti-punchthrough region 36 functions to keep a depletion layer which extends from a pn junction between the extended drain region 33 and the p-type silicon substrate 31 when a high voltage is applied to the drain electrode from contact with a source region 40b (see FIG. 9B). In other words, the anti-punchthrough region 36 prevents a leakage current (punchthrough phenomenon) from being produced when the depletion layer extending from the pn junction comes in contact with the source region 40b.

Figure 8C:
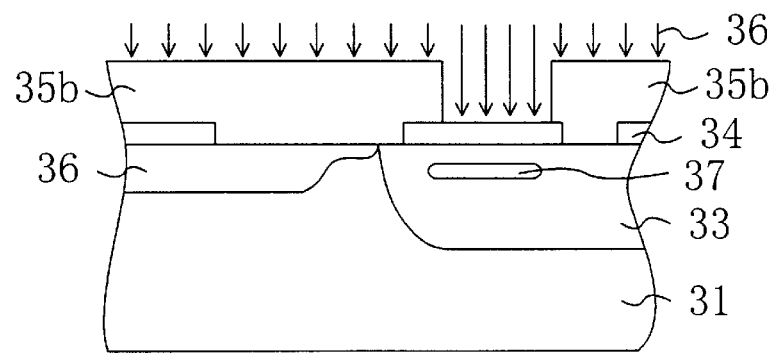

Next, as shown in FIG. 8C, a multilayer resist mask 35b having an opening configured to correspond to the p-type buried region 37 to be formed is formed on the p-type silicon substrate 31 by a photolithographic process. Thereafter, boron ions 36 are implanted into the extended drain region 33 via the multilayer resist mask 35b at a dose ranging from $3 \times 10^{13}$ cm$^{-2}$ to $3 \times 10^{13}$ cm$^{-2}$ and with an implant energy ranging from 1 MeV to 2 MeV, e. g., with 1.25 MeV by high-energy ion implantation. As a result, the p-type dopant for the p-type buried region 37 is implanted within the extended drain region 33.

Hereinafter, a detailed description will be given to a method of forming the multilayer resist mask 35b adopted in the present embodiment.

In the present embodiment, the p-type silicon substrate 31 is exposed to HMDS (hexamethyldisilazane) vapor under the pressure of nitrogen gas for about 10 to 20 minutes so that a resist solution spreads uniformly over the p-type silicon substrate 31.

Next, a resist application step is performed by rotating the p-type silicon substrate 31 and applying dropwise the resist solution onto the rotating p-type silicon substrate 31. The applied resist may be of either positive type or negative type. Here, a description will be given to the case where a positive resist is used.

To form the multilayer resist mask 35b having a thickness of 3 μm or more, the resist solution applied dropwise onto the p-type silicon substrate 31 in the present embodiment has a low viscosity of about 20 cp to 25 cp. During the application, the p-type silicon substrate 31 is rotated at a speed of about 4500 to 5000 rpm. Such spin coating enables the formation of a resist film having a thickness of about 1 μm to 1.2 μm. The comparatively thin resist layers thus formed are stacked sequentially in overlapping relation to eventually form a multilayer resist film which has a thickness of 3 μm or more and excellent uniformity. If each of the resist layers is extremely thin, it is necessary to increase the total number of layers to be stacked so as to provide a multilayer resist film having a desired thickness. Conversely, if each of the resist layers is extremely thick, the thickness thereof varies over the surface of the p-type silicon substrate 31, which results in variations in the thickness of the multilayer resist film. Hence, the thickness of each of the resist layers is preferably defined within the range of about 1 μm to 1.2 μm.

Preferably, the multilayer resist mask 35b has a thickness ranging from 3 μm to 5 μm. In the arrangement, the born ions are prevented from passing through the multilayer resist mask 35b even when they are implanted by high-energy ion implantation.

To vaporize the solvent contained in the resist layers, the present embodiment heats the p-type silicon substrate 31 having the resist layer formed on the surface thereof on a hot plate oven at a temperature of 110° C. or lower for about 1 minute (first heat treatment). The heating of the resist layer at a relatively low temperature ensures gradual vaporization of the solvent, which prevents the generation of gas from the multilayer resist film and therefore the rupture of the resist film when it is exposed to UV radiation. Thereafter, heating is performed at a temperature ranging from 110° C. to 130° C. for about 2 minutes (second heat treatment), whereby the process of removing the solvent from the resist layer is completed. Since the second heat treatment is thus performed at a temperature higher than the first heat treatment, the solvent remaining in the resist layer can be removed in a shorter period of time and the heating process step subsequent to development can be performed at a lower temperature.

By repeating the foregoing application step and first and second heat treatment steps, the second and subsequent resist layers are stacked to form the multilayer resist film. What is important here is to perform the heat treatment steps with respect to each of the resist layers after the step of applying each of the resist layers. By performing the heat treatment steps with respect to the resist layer every time the resist solution is applied to form a resist layer, the solvent contained in each of the second and subsequent layers is prevented from encroaching on the lower resist layers. As a result, there can be prevented the swelling of the lower resist layers due to the encroachment of the solvent and the resulting nonuniform film thickness. In addition, the solvent can also be removed with improved efficiency. Preferably, the foregoing heat treatment steps are performed immediately after the application of the resist layer (e.g., within 5 minutes after the application of the resist layer).

Since the present embodiment repeats the step of applying a resist layer and the heat treatment steps, a multilayer resist film having a desired thickness and less susceptible to deformation is provided and the generation of gas from the resist film when it is exposed to UV radiation can be prevented.

Instead of using the foregoing method, it is also possible to apply a resist film having a viscosity of about 50 cp to 60 cp, while rotating the p-type silicon substrate 31 at about 5000 rpm to 6500 rpm. In that case, heating may be performed appropriately on a hot plate oven at a temperature of 110° C. or less about 1 minute (first heat treatment) and then at a temperature ranging from 110° C. to 130° C. for 3 minutes (second heat treatment). In this case, the first heat treatment is performed for a longer time since the solvent contained in the resist with a higher viscosity is less likely to be removed.

Next, the multilayer resist film is subjected to exposure using a G-line stepper and the exposed multilayer resist film is developed to form the multilayer resist mask 35b having an opening configured to correspond to the p-type buried region 37.

The developing solution and rinsing solution used in the development step contains water which is likely to penetrate into the multilayer resist mask 35b. To remove the water contained in the multilayer resist mask 35b, the heating step (third heat treatment) is performed again after the development step. The heating step is preferably performed at a low temperature of 100° C. or lower for a short time. This is because, if the heating is performed at a high temperature for a long time, the cross-sectional configuration of the multilayer resist mask 35b is degraded. In the case of the present embodiment, heating is performed at 80° C. for about 150 seconds. Since the heating step is performed at a relatively low temperature, it is possible to remove the water penetrated into the multilayer resist mask 35b during the development step, while maintaining the pattern configuration observed immediately after the development.

By using the G-line stepper which is an exposing apparatus with high resolution, the pattern is transferred onto the multilayer resist film without incurring blurred delineation, resulting in the multilayer resist mask 35b having a near-rectangular cross section.

It is to be noted that the p-type dopant ions for forming the p-type buried region 37 should be implanted after the formation of the LOCOS regions 34. If the implantation of the p-type dopant ions is performed prior to the formation of the LOCOS regions 34, the implanted dopant ions (boron ions) are diffused in the surface region of the p-type silicon substrate 31 by the heat treatment during the formation of the LOCOS regions 34. As a result, the electric property of the p-type dopant in the surface region of the extended drain region 33 is cancelled out by that of the p-type dopant and the ON-state resistance of the MOSFET is increased disadvantageously.

Figure 8D:
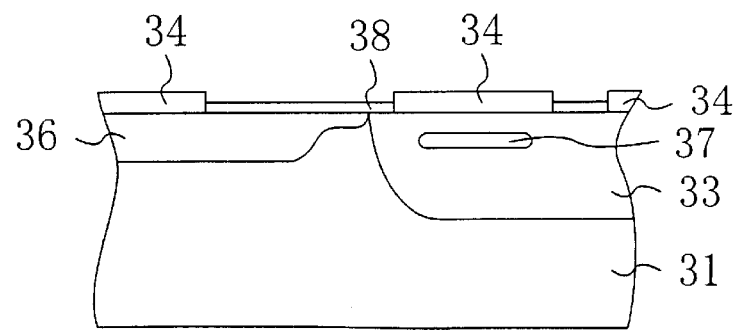
Figure 9A:
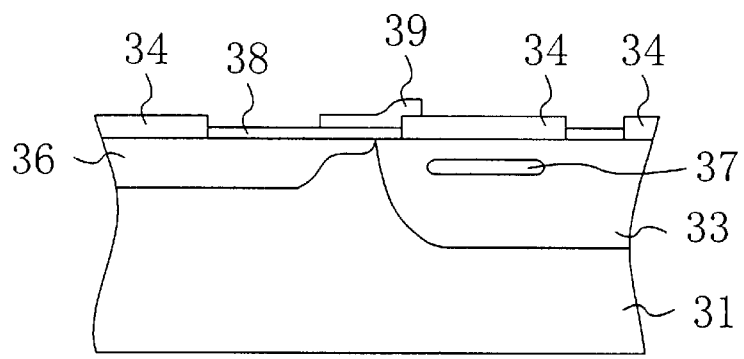

Next, as shown in FIG. 8D, the multilayer resist mask 35b is removed and then a gate oxide film 38 is formed on the exposed surface of the p-type silicon substrate 31. Thereafter, a gate electrode 39 composed of a polysilicon film is formed as shown in FIG. 9A. The gate electrode 39 is obtained by depositing a polysilicon film on the p-type silicon substrate 31 and patterning the polysilicon film by using lithographic and etching techniques.

Figure 9B:
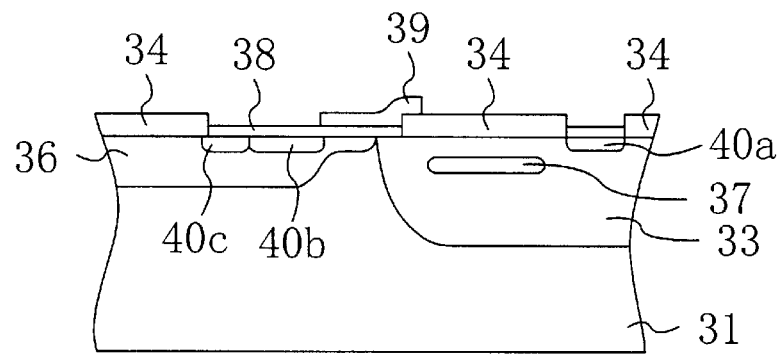

Next, the surface of the p-type silicon substrate 31 is covered with an implantation mask (not shown). Then, arsenic ions are implanted into the p-type silicon substrate 31 at a dose of $6.0 \times 10^{15}$ cm$^{-2}$ and with an implant energy of 60 keV, whereby the n$^+$-type doped region functioning as a drain contact region 40a or source region 40b is formed within the p-type silicon substrate 31, as shown in FIG. 9B.

After the implantation mask is removed, the surface of the p-type silicon substrate 31 is further covered with another implantation mask (not shown). Then, boron ions are implanted into the silicon substrate at a dose of $2.0 \times 10^{15}$ cm$^{-2}$ and with an implant energy of 50 keV, whereby the p$^+$-type impurity region 40c is formed within the anti-punchthrough region 36. The p$^+$-type impurity region 40c serves to reduce the contact resistance between the p-type silicon substrate 31 and anti-punchthrough region 36 and an electrode for supplying a specified potential with respect thereto.

Figure 9C:
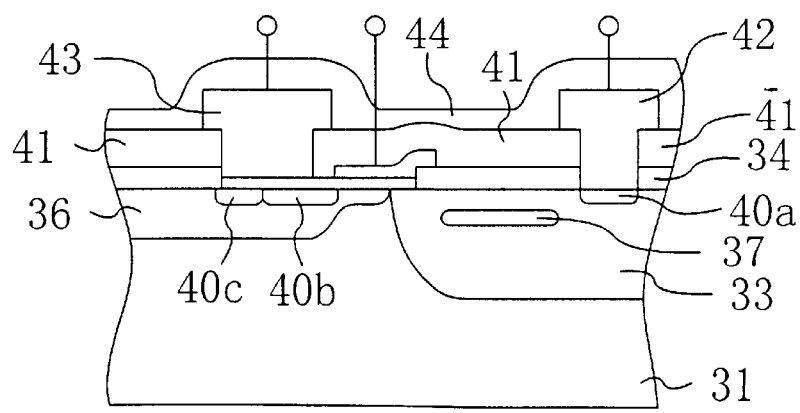

Next, as shown in FIG. 9C, an interlayer insulating film (thickness: about 1 to 1.5 $\mu$m) 41 is deposited and a contact hole is formed in the interlayer insulating film 41. Subsequently, a drain electrode 42 to be connected to the drain contact region 40a and a source electrode 43 to be connected to the source region 40b and to the P$^+$-type doped region 40c are formed. The resulting structure is then covered with a protective film 44, thereby providing a lateral MOSFET according to the present embodiment.

Since the present embodiment has formed the p-type buried region 37 by high-energy ion implantation using the multilayer resist mask 35b, the p-type buried region 37 can be formed with excellent reproducibility and uniformity so that variations in transistor characteristics are reduced.

Figure 12A:
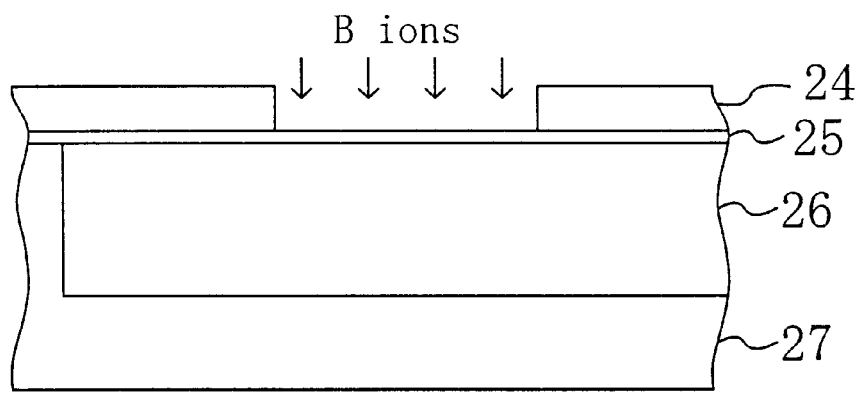
FIGS. 12A and 12B are cross-sectional views illustrating the process steps of forming a p-type buried region by high-energy ion implantation.
Figure 12B:
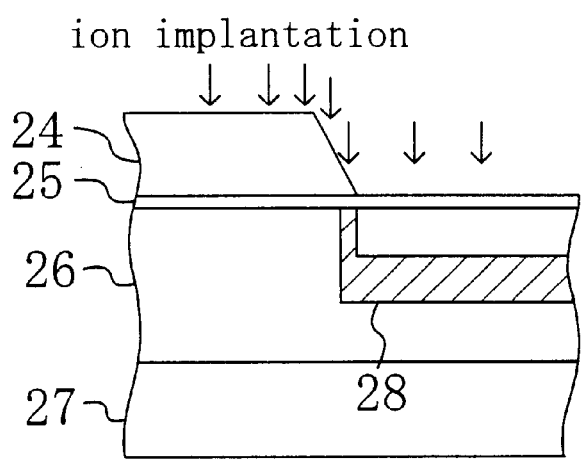

Since the present embodiment has solved the problem of the deformation of the resist illustrated in FIG. 12B, a sufficiently low ON-state resistance can be achieved with excellent reproducibility without forming an n-type heavily doped region between the surface of the silicon substrate and the buried region.

The additional doping step for forming the n-type heavily doped region effected in accordance with the fabrication method of the other embodiment may also be effected in accordance with the fabrication method of the present embodiment. Specifically, the step illustrated in FIG. 3C may also be performed after the step illustrated in FIG. 8D. As a result, the ON-state resistance can further be reduced.

It will easily be appreciated that, even when the conductivity types are inverted in each of the embodiments, the present invention successfully achieves its effects.

What is claimed is:

1. A method for fabricating a semiconductor device comprising:
   a semiconductor layer of a first conductivity type;
   a source region of a second conductivity type formed within the semiconductor layer;
   a drain region of the second conductivity type formed within the semiconductor layer;

a channel region provided between the source and drain regions;

a gate electrode formed over the channel region; and a buried region of the first conductivity type having at least a part included in the drain region, the method comprising the steps of:

doping the semiconductor layer with a dopant of the second conductivity type for the drain region; and doping the semiconductor layer with a dopant of the first conductivity type for the buried region, the step of doping the semiconductor layer with the dopant of the first conductivity type including the steps of:

forming, on the semiconductor layer, a multilayer resist mask having an opening configured to correspond to the buried region; and implanting ions of the dopant of the first conductivity type into the semiconductor layer via the multilayer resist mask by high-energy ion implantation.

2. The method for fabricating a semiconductor device according to claim 1, wherein the step of doping the semiconductor layer with the dopant of the first conductivity type is performed by using boron ions as the ions of the dopant of the first conductivity type under implant conditions in which a doze ranges from $1\times10^{13}$ cm$^{-2}$ to $3\times10^{13}$ cm$^{-2}$ and an implant energy ranges from 1 MeV to 2 MeV.

3. The method for fabricating a semiconductor device according to claim 1, wherein the multilayer resist mask has a thickness ranging from 3 $\mu$m to 5 $\mu$m.

4. A method for fabricating a semiconductor device comprising: a semiconductor layer of a first conductivity type; a source region of a second conductivity type formed within the semiconductor layer; a drain region of the second conductivity type formed within the semiconductor layer; a channel region provided between the source and drain regions; a gate electrode formed over the channel region; and a buried region of the first conductivity type having at least a part included in the drain region, the method comprising the steps of:

doping the semiconductor layer with a dopant of the second conductivity type for the drain region; and doping the semiconductor layer with a dopant of the first conductivity type for the buried region, the step of doping the semiconductor layer with the dopant of the first conductivity type including the steps of:

forming, on the semiconductor layer, a multilayer resist mask having an opening configured to correspond to the buried region and composed of a plurality of stacked resist layers each having a thickness ranging from 1 $\mu$m to 1.2 $\mu$m; and implanting ions of the dopant of the first conductivity type into the semiconductor layer via the multilayer resist mask by high-energy ion implantation.

5. The method for fabricating a semiconductor device according to claim 4, wherein the step of forming the multilayer resist mask includes the steps of:

forming the plurality of resist layers by spin coating;

performing a first heat treatment at a first temperature with respect to each of the plurality of resist layers; and performing a second heat treatment at a second temperature equal to or higher than the first temperature with respect to each of the plurality of resist layers.

6. The method for fabricating a semiconductor device according to claim 5, wherein the first temperature is 110° C. or lower and the second temperature ranges from 110° C. to 130° C.

7. The method for fabricating a semiconductor device according to claim 4, wherein the step of forming the multilayer resist mask includes the step of heating the plurality of stacked resist layers at a temperature of 100° C. or lower after exposing and developing the resist layers.

8. The method for fabricating a semiconductor device according to claim 4, wherein each of the plurality of resist layers is formed by applying a resist solution having a viscosity of 20 cp to 25 cp.

9. A method for fabricating a semiconductor device comprising: a semiconductor layer of a first conductivity type; a source region of a second conductivity type formed within the semiconductor layer; a drain region of the second conductivity type formed within the semiconductor layer; a channel region provided between the source and drain regions; a gate electrode formed over the channel region; and a buried region of the first conductivity type having at least a part included in the drain region, the method comprising the steps of:

doping the semiconductor layer with a dopant of the second conductivity type for the drain region;

doping the semiconductor layer with a dopant of the first conductivity type for the buried region; and doping the semiconductor layer with the dopant of the second conductivity type to form a heavily doped region of the second conductivity type, with a density higher than the drain region, in a region above the buried region and between a surface of the semiconductor layer and the buried region.

10. The method for fabricating a semiconductor device according to claim 9, wherein the heavily doped region has a thickness of 0.5 $\mu$m or more.

11. The method for fabricating a semiconductor device according to claim 9, wherein the heavily doped region has a dopant concentration of $1\times10^{17}$ cm$^{-3}$ or higher.

* * * * *